(12) United States Patent
Eugene Lee et al.

(10) Patent No.: US 10,515,928 B2
(45) Date of Patent: Dec. 24, 2019

(54) STACKED SEMICONDUCTOR SYSTEM HAVING INTERPOSER OF HALF-ETCHED AND MOLDED SHEET METAL

(71) Applicant: Texas Instruments Incorporated, Dallas, TX (US)

(72) Inventors: Lee Han Meng@ Eugene Lee, Johor (MY); Anis Fauzi bin Abdul Aziz, Meleka (MY); Khoo Yien Sien, Meleka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 803 days.

(21) Appl. No.: 14/167,647

(22) Filed: Jan. 29, 2014

(65) Prior Publication Data

US 2015/0214198 A1 Jul. 30, 2015

(51) Int. Cl.
*H01L 25/16* (2006.01)
*H01L 23/00* (2006.01)
(Continued)

(52) U.S. Cl.
CPC ............ *H01L 24/97* (2013.01); *H01L 21/78* (2013.01); *H01L 23/49531* (2013.01); *H01L 23/49537* (2013.01); *H01L 23/49575* (2013.01); *H01L 23/49861* (2013.01); *H01L 21/561* (2013.01); *H01L 23/3121* (2013.01); *H01L 24/13* (2013.01); *H01L 24/16* (2013.01); *H01L 24/29* (2013.01); *H01L 24/32* (2013.01); *H01L 24/33* (2013.01); *H01L 24/83* (2013.01); *H01L 2224/0401* (2013.01); *H01L 2224/04026* (2013.01); *H01L 2224/06181* (2013.01); *H01L 2224/131* (2013.01); *H01L 2224/16245* (2013.01); *H01L 2224/291* (2013.01); *H01L 2224/32245* (2013.01);
(Continued)

(58) Field of Classification Search
CPC ............ H01L 23/4951; H01L 23/49548; H01L 23/49838
USPC ......... 361/760–764, 795, 813; 257/666–668, 257/685–703
See application file for complete search history.

(56) References Cited

U.S. PATENT DOCUMENTS 6,281,568 B1 * 8/2001 Glenn ................. H01L 23/3107 257/666
6,953,988 B2 * 10/2005 Seo ...................... H01L 23/4951 257/666

(Continued)

*Primary Examiner* — Tuan T Dinh
(74) *Attorney, Agent, or Firm* — Dawn Jos; Charles A. Brill; Frank D. Cimino (57) ABSTRACT

A semiconductor system (900) has a flat interposer (510) with a first surface (401*a*) in a first plane, a second surface (401*b*) in a parallel second plane, and a uniform first height (401) between the surfaces; the interposer is patterned in metallic zones separated by gaps (412, 415), the zones include metal of the first height and metal of a second height (402) smaller than the first height; an insulating material fills the gaps and the zone differences between the first and the second heights. Semiconductor chips of a first (610) and a second (611) set have first terminals attached to metallic zones of the first interposer surface while the chips of the second set have their second terminals facing away from the interposer. A first leadframe (700) is attached to the second terminals of the second set chips, and a second leadframe (800) is attached to respective metallic zones of the second interposer surface.

8 Claims, 8 Drawing Sheets

(51) Int. Cl.
*H01L 23/495* (2006.01)
*H01L 21/78* (2006.01)
*H01L 23/498* (2006.01)
*H01L 23/31* (2006.01)
*H01L 21/56* (2006.01)

(52) U.S. Cl.
CPC .............. *H01L 2224/33181* (2013.01); *H01L 2224/83851* (2013.01); *H01L 2224/97* (2013.01); *H01L 2924/1306* (2013.01); *H01L 2924/14* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *Y10T 29/49204* (2015.01)

(56) References Cited

U.S. PATENT DOCUMENTS

| | | | |
|---|---|---|---|
| 7,541,668 B2 * | 6/2009 | Choi | H01L 23/49548 257/666 |
| 2012/0228696 A1 * | 9/2012 | Carpenter | H01L 23/49575 257/329 |
| 2012/0326287 A1 * | 12/2012 | Joshi | H01L 23/49548 257/676 |
| 2014/0191378 A1 * | 7/2014 | Lee | H01L 23/49838 257/668 |

* cited by examiner

STACKED SEMICONDUCTOR SYSTEM HAVING INTERPOSER OF HALF-ETCHED AND MOLDED SHEET METAL

FIELD OF THE INVENTION

The present invention is related in general to the field of semiconductor devices and processes, and more specifically to semiconductor systems with an interposer of half-etched and molded sheet metal.

DESCRIPTION OF RELATED ART

Electronic products have, at their core, printed circuit boards, which assemble and interconnect the semiconductor devices, passive components, control devices, power supplies, and display devices, which are needed in the particular product. Today, an increasing number of these electronic products, such as hand-held wireless telephones, smartphones, electronic cameras, portable computers, and controls and sensors in automobiles and airplanes are subjected to market trends, which require an on-going shrinking of the product outlines and weight, and for which, therefore, the size, space, and weight required by the boards are at a premium. At the same time, electrical product requirements for higher speed and greater power are becoming more demanding.

In order to shrink board outlines, present technology focuses on reducing the board area consumed by each individual part assembled on a board; for instance, concerted efforts are expended to shrink the package of semiconductor devices and passive components. In addition, stacking of integrated circuit chips and passive components is widely practiced. It is, however, becoming ever more difficult to provide for enough thermal conductors to dissipate the generated heat and routing traces for conducting high currents.

When semiconductor chips are to be mounted on substrates or interposers to form today's semiconductor packages, the substrates and interposers are commonly made of plastic or ceramic materials. Plastic boards and substrates are low cost compared to other solutions such as ceramic materials, especially when component interconnection is achieved by wire bonding; for many substrates, though, it is essential to provide a capability for plating thick metal layers.

Driven by the desire to reduce the board area needed to assemble a semiconductor device into electronic products such as hand-held telephones, today's semiconductor devices often use vertically stacked chips inside the packages. These chip stacks frequently include chips of significantly different sizes, assembled mostly by wire bonding techniques on interposers made of plastic or ceramic materials. The chip stacks often have to be further integrated with passive components. Proper interconnections of these chips and components and signal routing have to be reconciled with low resistance routing required for conducting high currents and dissipating the heat generated in operation. And, without special emphasis, there is always the relentless market pressure to keep product structure and fabrication process at low cost.

For interposers, in addition to plastic and ceramic substrates with wire bonding and flip-chip assembly, embedded structures have been employed. In these structures, chips have been inserted and electrically connected into multi-metal-layer substrates, which can serve as completed structures or as interposers. While these embedded structures may satisfy electrically and thermally and do not need plating of thick metal layers, they are subject to warpage and require an expensive fabrication sequence.

SUMMARY OF THE INVENTION

When applicant analyzed and compared interposers with regard to electrical characteristics and cost of the interconnection technologies of wire-bonding, flip-chip solder reflowing, and soldering clips for electrical interconnections, applicants realized that a common concept for using these technologies is the approach to consider the parts isolated until they become interconnected by conducting traces. Based on this concept, an interposer starts with a ceramic or plastic material, which is processed in order to add conducting traces for integrating the components into a system.

Applicants discovered that recurring problems such as simultaneously creating connections of low current (for signals) and high currents (for power) and dissipating heat (for cooling operations) may diminish when the opposite approach is adopted, wherein the parts are considered connected until they become isolated by inserting insulator regions. Based on the latter concept, an interposer can be made from a flat sheet of metal, which is processed to include portions of high conductance, of low conductance, and of effective insulation.

Applicant solved the problem of forming a low cost interconnect structure for a multi-layer stacked system, which is suitable for signal and power routing as well as heat dissipation, when they discovered an interposer structure, which starts from a flat strip of sheet metal, is then processed through a series of low cost steps to create customized insulating regions different on top and bottom sheet surfaces, and results in an interposer suitable for stacking chips and passive components in a package.

In the method, a flat strip of metal sheet with a first thickness, a first surface in a first plane, and a second surface in a parallel second plane is patterned into a plurality of device sites and each site into a plurality of metal zones separated by gaps. Thereafter, starting from the second surface, metal is removed from at least portions of certain zones (preferably by etching) in order to reduce the first thickness to a second thickness smaller than the first thickness. The gaps and the thinned zone portions are then filled with an insulating material (preferably a molding compound) bordered by the first and the second plane. Thereby a flat interposer is created, which has a network of metallic zones interdigitated with insulating zones, wherein the configuration of the zones on the first surface is different from the configuration on the second surface.

Sets of semiconductor chips are provided; the first set includes chips with first terminals on a first chip surface, the second set includes with first terminals on a first surface and second terminals on the opposite second surface. The first terminals of the first and second set chips are attached to respective metal zones of the first interposer surface, whereby the second terminals of the second set chips face away from the interposer. Respective pads of a first leadframe are then attached to the second terminals of the second set chips, and respective pads of a second leadframe are attached to metal zones of the second interposer surface.

Passive electronic components may be attached to the surface of the first leadframe opposite the second terminals of the second set chips. The stacked semiconductor system with the attached components may be packaged in an encapsulation compound. Finally, the package strip can be singulated into discrete packaged semiconductor systems.

BRIEF DESCRIPTION OF THE DRAWINGS

FIGS. 4 to 10 show certain steps in the fabrication flow of an exemplary interposer and stacked semiconductor system.

DETAILED DESCRIPTION OF THE PREFERRED EMBODIMENTS

Figure 1:
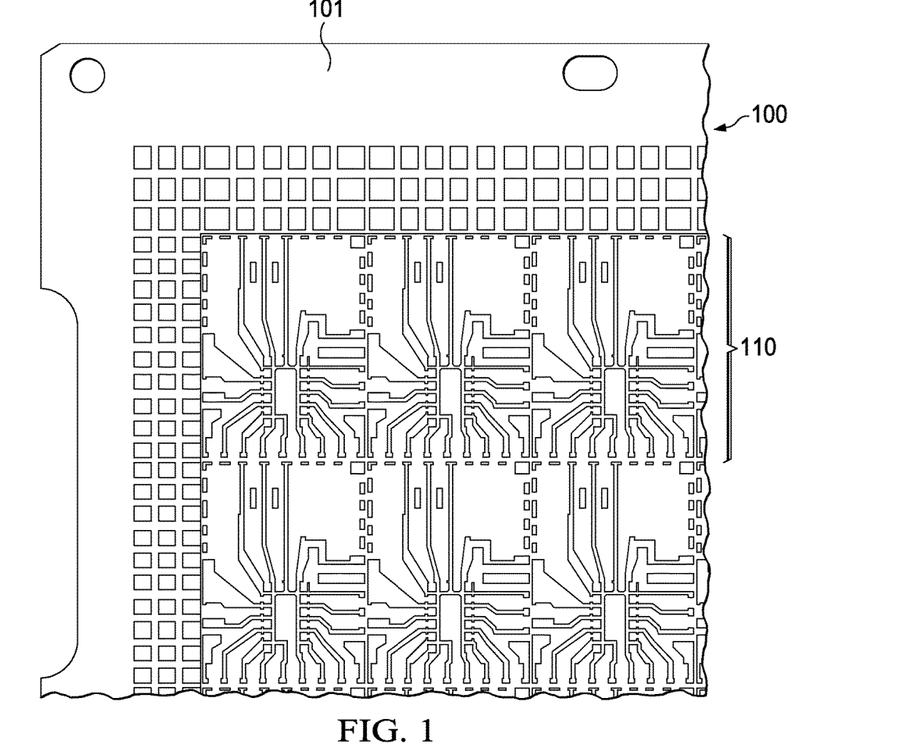
FIG. 1 shows a top view of a number of exemplary interposer units, which have been formed in a portion of a sheet metal strip.

FIG. 1 shows, in top view, an embodiment of the invention. FIG. 1 displays a portion of a metal strip generally designated 100, which includes a plurality of structures 110 herein referred to as interposers. As FIG. 1 indicates, strip 100 has a first surface 101 in a first plane. Strip 100 is a flat sheet; consequently, it has a second surface (not shown in FIG. 1) in a second plane parallel to the first plane. Between the first surface 101 and the second surface, the flat sheet of strip 100 has a uniform first thickness.

The flat sheet of strip 100 is electrically conductive; preferably, the flat sheet is a metal selected from a group including copper, copper alloys, aluminum, iron-nickel alloys, and Kovar™. As a flat sheet, strip 100 has a thickness, which is herein referred to as first height. When the sheet is made of copper, the preferred first height of the metal sheet is between 100 and 300 μm.

The portion of strip 100 shown in FIG. 1 illustrates that the plurality of interposers of strip 100 includes identical and repetitive interposers 110. One of these interposers 110 is enlarged in FIG. 2 in top view and in FIG. 3 in bottom view. As FIG. 2 indicates, the sheet of interposer 110 is patterned in metallic zones 111 separated by gaps 112. The gaps are filled with electrically insulating material. Preferably, the insulating material is a molding compound.

Figure 2:
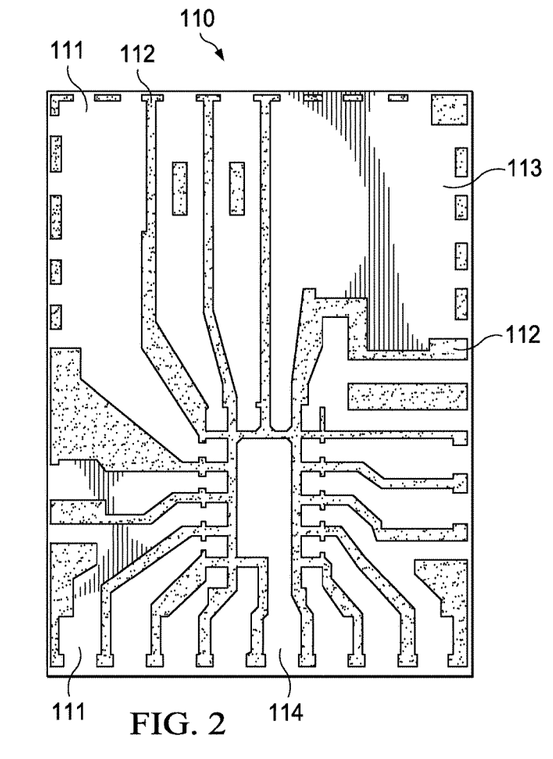
FIG. 2 illustrates a top view of a discrete unit of the exemplary interposer strip shown in FIG. 1.
Figure 3:
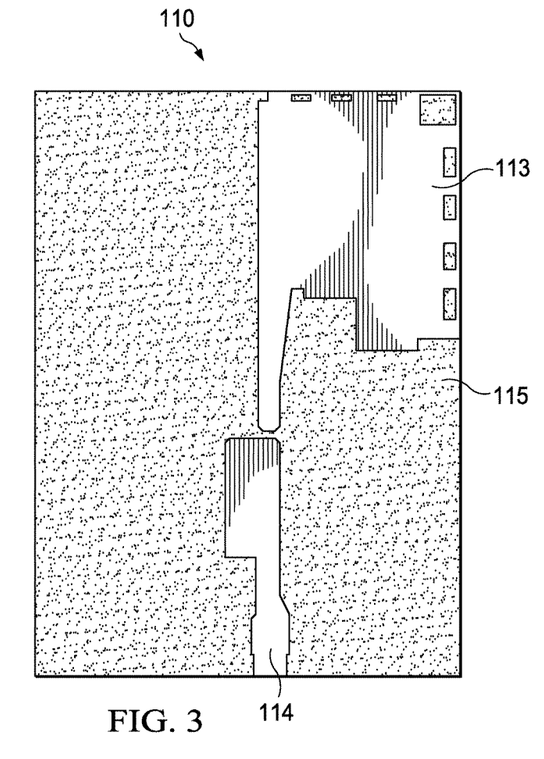
FIG. 3 depicts a bottom view of the discrete unit of exemplary interposer shown in FIG. 2.

A comparison of the top view of interposer 110, shown in FIG. 2, with the bottom view of the same interposer, shown in FIG. 3, indicates that the distribution of metallic zones is different on the first surface of the interposer and the second surface. As the bottom view of FIG. 3 shows, not only the gaps but considerably larger areas are filled with insulating material.

Figure 4:
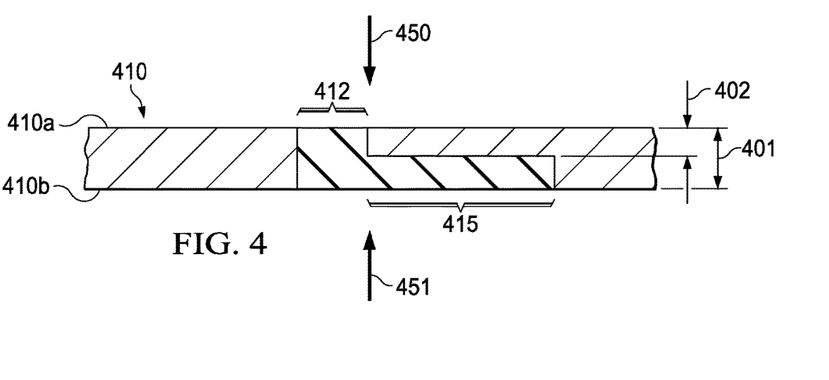
FIG. 4 is a cross section of a portion of an interposer, after a flat sheet metal has been processed through the steps of patterning and partial thinning.

As the cross section of an interposer portion in FIG. 4 explains, viewing the second surface 410b of the interposer from the bottom in the direction of arrow 451 reveals much larger areas filled with insulating material compared to viewing the first surface 410a of the interposer from the top in the direction of arrow 450, because portions of certain metallic zones have been half-etched in order to thin these zone portions so that first height 401 is reduced to second height 402. Second height 402 is smaller than first height 401. The thinned portions of the zone are then filled with insulating material 115, preferably molding compound. Consequently, the bottom view 451 of the interposer reveals larger insulating areas and reduced metallic areas compared to top view 450.

The interposer displayed in FIGS. 2 and 3 is a flat, sheet supporter for semiconductor devices with a network of metallic zones interdigitated with insulating zones of different metallic-to-insulator ratios between top and bottom surfaces originating from different heights of metallic and insulating zones. In FIG. 3, the zones designated 113 and 114 have the same configuration in FIG. 2, indicating that these zones have the undiminished metal height 401. Consequently, zones 113 and 114 have low electrical and thermal resistance and are thus especially suitable to carry large electrical currents and to dissipate thermal energy.

Another embodiment of the invention is a method for fabricating an interposer 110 for semiconductor devices. The process flow starts with providing a flat sheet 410 of electrical conductor with a first height 401, a first surface 410a in a first plane, and a second surface 410b in a second plane. The conductor is preferably a metal selected from a group including copper, aluminum, iron-nickel alloys, and Kovar™; the first height 401 is preferably in the range from 100 to 300 μm.

In the next step, the sheet is patterned, preferably by etching, into a plurality of metal zones 111 separated by gaps 412. The patterning technique may be selected from a group including etching, stamping, planishing, and ion milling. Next, starting from the second surface 410b of the sheet, metal is removed from at least portions 415 of certain zones in order to reduce the first height 401 to a second height 402 smaller than the first height. Next, the gaps 412 and the thinned zone portions 415 are filled with an insulting material bordered by the first and the second plane. First surface 410a is planar throughout the first plane, and the second surface 410b is planar throughout the second plane. The preferred filling technique is molding with a polymeric compound. A flat interposer is thus created with a network of metallic zones interdigitated with insulating zones of different metal-to-insulator ratios between top surface 410a and bottom surface 410b.

Figure 5:
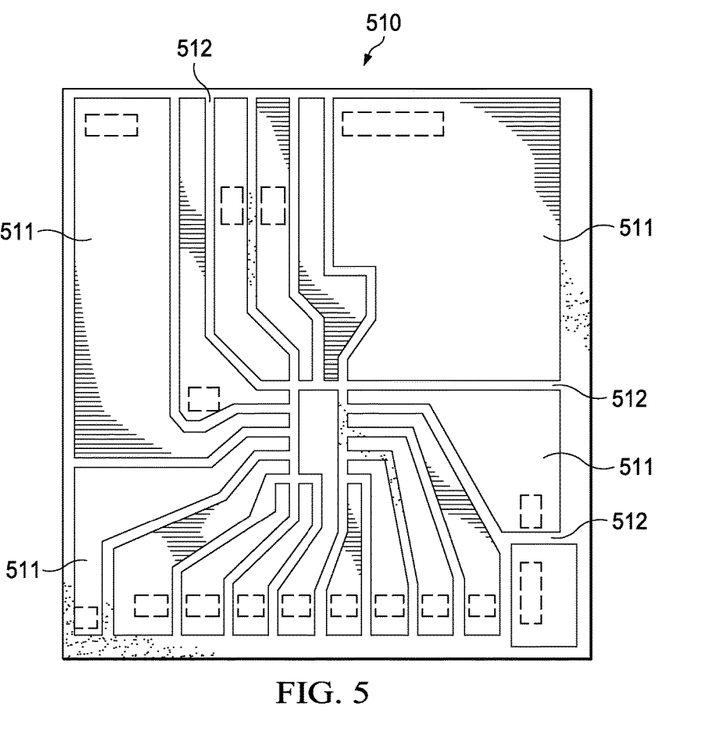
FIG. 5 shows a top view of an exemplary interposer unit after the steps of patterning the metal zones and filling the gaps between the zones with insulating material.
Figure 6:
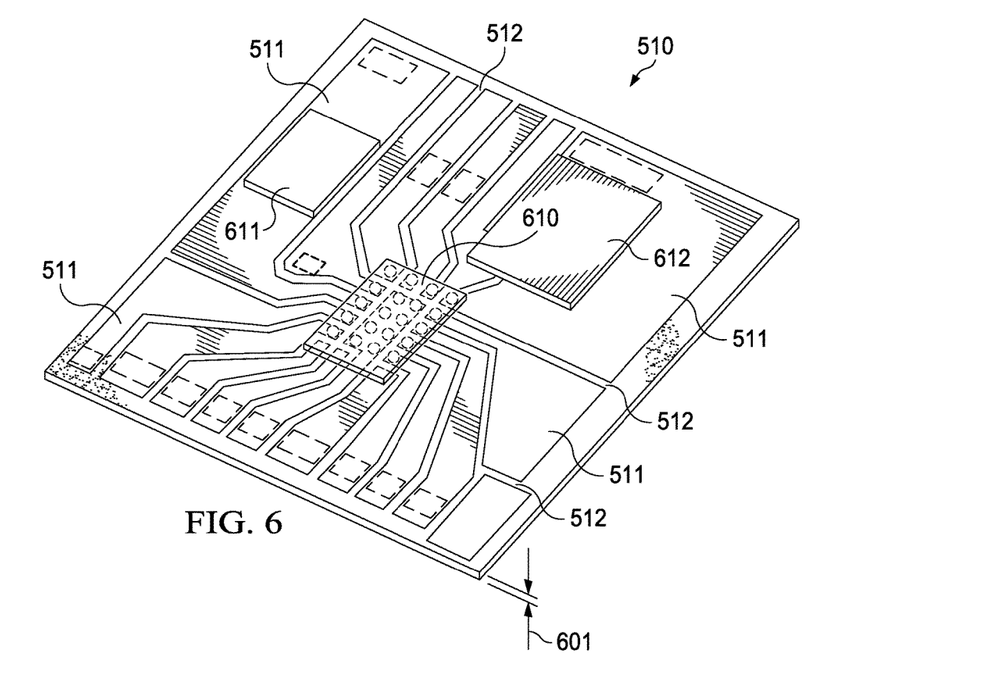
FIG. 6 illustrates a perspective view of the interposer unit of FIG. 5 after attaching an up- and a down-field-effect transistor and flip-attaching an integrated circuit.

Another embodiment of the invention is a stacked semiconductor system, which includes an interposer of half-etched and molded sheet metal. An exemplary system and its construction are illustrated in FIGS. 5 to 10. FIG. 5 shows the top surface (first surface) of an interposer 510 with a layout of the metallic zones for assembling flip-assembled integrated circuit chips and field-effect transistors chips (with vertical terminals), as they are used for a synchronous Buck converter. The top surface (first surface) of the interposer is designated 510a in FIG. 6; surface 510a is planar, i.e., is in a first plane. FIG. 6 shows that interposer 510 has a height 601; the second surface 510b is in a parallel second plane. Consequently, interposer 510 has a sheet-like configuration.

The top surface of interposer 510 is patterned in metallic zones 511 separated by gaps 512. As mentioned, metallic zones 511 have a variety of shapes and sizes, selected and designed to be suitable for attaching semiconductor chips. In addition, certain zones have metal thickness reduced from the original height and instead filled with insulating material. These zones are intended to conduct small electrical currents for signals, while zones with undiminished metal height are capable of conducting large electrical currents for power and dissipating thermal energy. It is preferred that selected areas of the metallic zones have a metallurgical surface composition suitable for solder attachment; examples are gold-clad copper surfaces. Other selected areas may have a metallurgical (for instance, noble) surface for low resistance contact by other metals, such as tabs of copper leadframes. In FIG. 5, exemplary landing areas for leadframes tabs are marked by dashed outlines (see also FIG. 9B).

Gaps 512 are filled with insulating material, preferably molding compound due to ease of fabrication (see below). In addition, insulating material, such as molding compound, is filling all spaces opened by thinning the metal of selected zones; the insulating material is filling the opened spaces up to the first and second planes so that the whole interposer remains planar.

FIG. 6 depicts several semiconductor chips attached to the metallic zones of the interposer of FIG. 5. In the example described, the chips come in two sets. Semiconductor chips of a first set include integrated circuits with attached solder balls suitable for flip-chip attachment; semiconductor chips of a second set include vertical field-effect transistors with terminals on a first chip surface and terminals on the opposite second chip surface. Chip 610 is a chip of the first set; in the example of FIG. 6, it represents a control chip for a Buck converter, including an integrated circuit and an array of terminals with attached solder balls. FIG. 6 depicts chip 610 flipped onto the first surface of the interposer so that each solder ball contacts a respective metallic zone. (For clarity purposes, chip 601 is shown as being transparent in FIG. 6).

Chips 611 and 612 are chips of the second set. (For clarity purposes, the chips are shown in FIG. 6 as being transparent). As FIG. 6 indicates, the first chip terminals on the first chip surfaces are attached to respective metallic zones, while the second chip terminals on the second chip surfaces face away from the interposer and are thus directly visible in the top view of FIG. 6.

Figure 7:
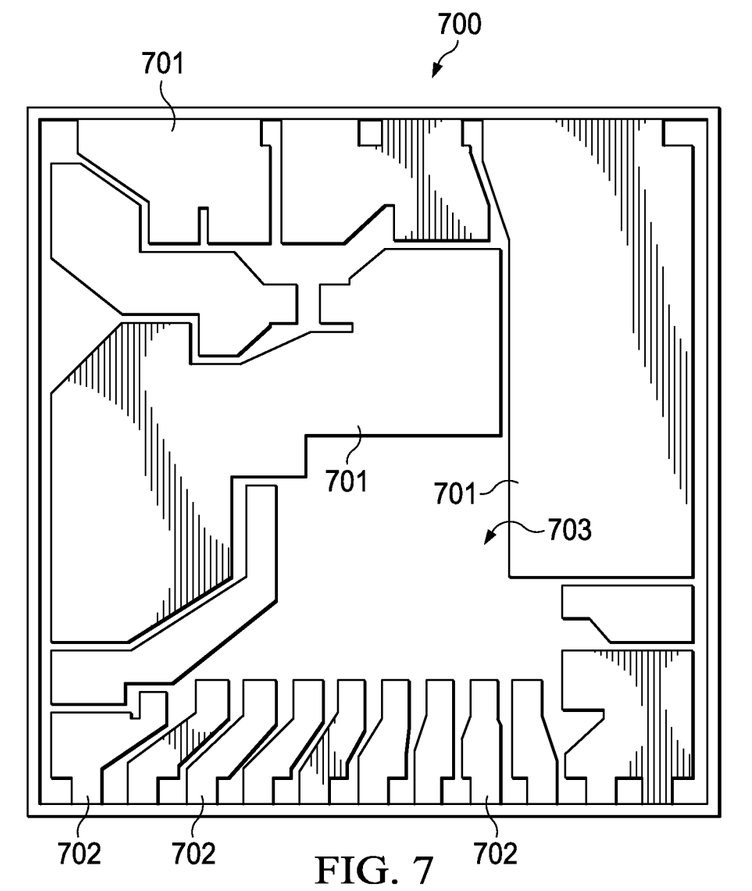
FIG. 7 shows a top view of an exemplary first leadframe suitable as top leadframe for stacking a semiconductor system.
Figure 8:
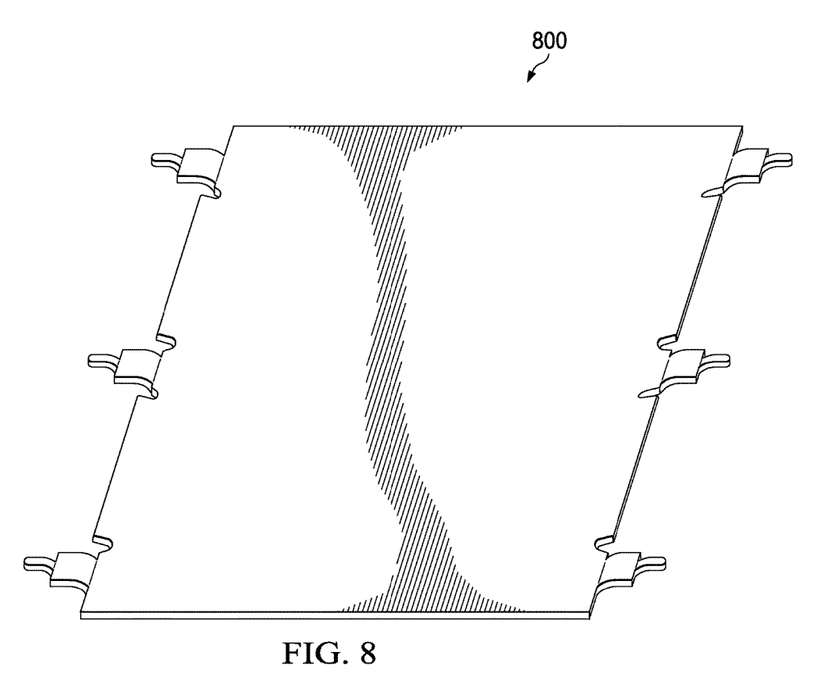
FIG. 8 shows a perspective view of an exemplary second leadframe suitable as bottom leadframe for stacking a semiconductor system.

In order to contact these second terminals of the second chip set, a leadframe 700 as illustrated in FIG. 7 is used. This leadframe is designed to have pads 701 and leads 702 for attachment to the second terminals (preferably by solder or a conductive adhesive) and to allow free space 703 for chips elevated by solder balls to a height larger than approximately a chip thickness.

Leadframe 700 of FIG. 7 is referred to as first leadframe. In addition, a second leadframe 800 is needed to contact the metallic zones of the second surface of the interposer, which are illustrated for this example in FIG. 3. The metal sheet, from which second leadframe 800 is manufactured (preferably by stamping), is preferably selected from a group of metal including, copper, aluminum, iron-nickel alloys, and Kovar™, and may have a thickness between about 100 and 300 μm. For reasons of easy assembly, one surface of the metal (designated 801 in FIG. 9B) may be plated with a layer of metal or compound suitable for soldering (such as tin, or nickel followed by palladium), or suitable as protection against corrosion (such as silver, or gold).

Figure 9A:
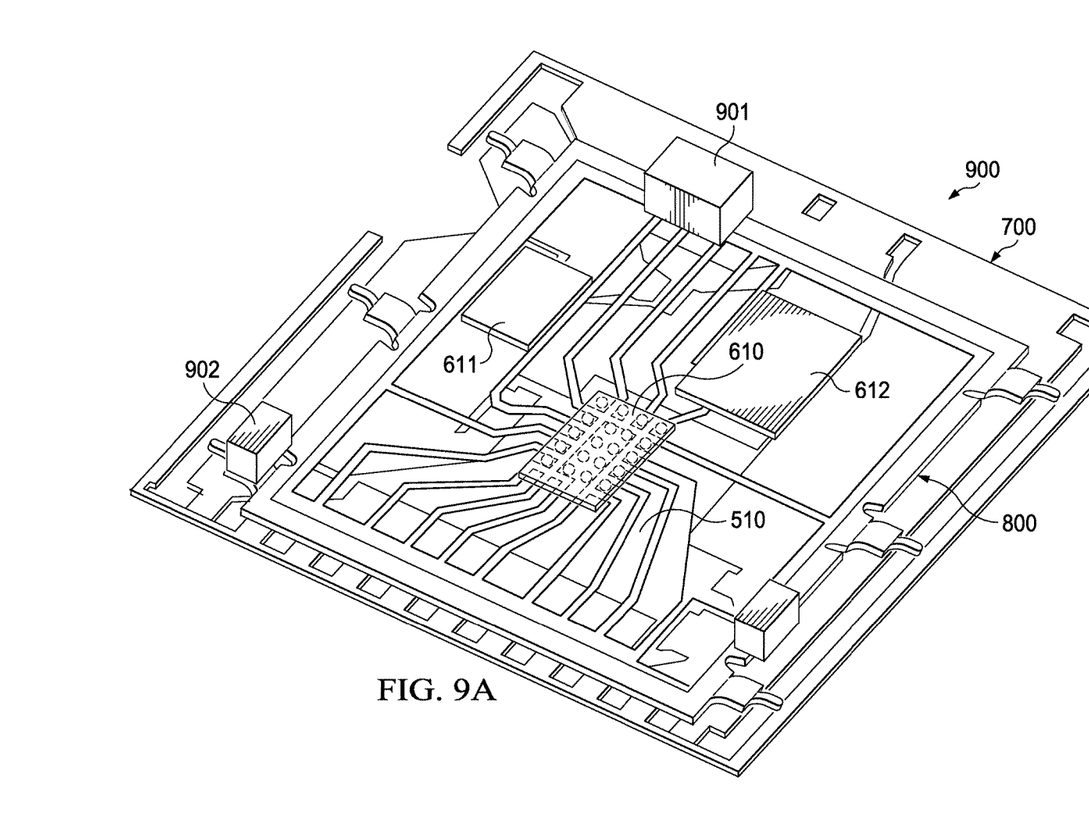
FIG. 9A illustrates a perspective view of the routing substrate integrating the exemplary semiconductor chips, passive components, the interposer and a top and a bottom leadframe.
Figure 9B:
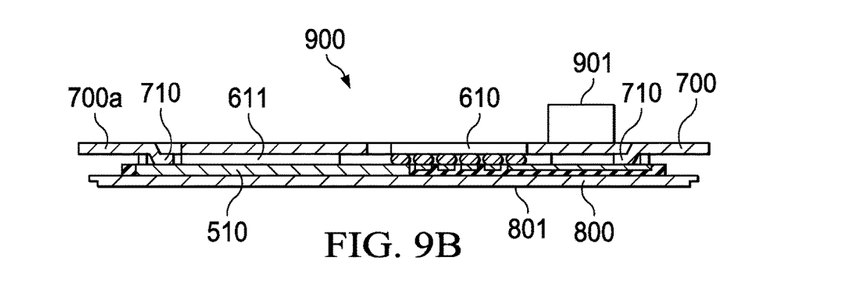
FIG. 9B depicts a cross section of the routing substrate of FIG. 9A integrating semiconductor chips, some passive components, the interposer and a top and a bottom leadframe.

Attaching the metallic zones of the second surface of the interposer 510 to the second leadframe 800, and then attaching the first leadframe 700 to the second terminals of the second set chips 611, produces the assembled substrate as depicted in FIGS. 9A and 9B. The interposer 510 is sandwiched between the first and the second leadframes. As required, passive components such as capacitors 901 and 902 and inductor 903 (see FIG. 10) may be attached to the surface 700a of the first leadframe 700 opposite the second terminals of the second set chips, forming a stacked semiconductor system 900. The attachment may use a material such as solder, conductive adhesive, z-axis conductor, or carbon nanotubes.

As FIG. 9B illustrates, it is helpful for the assembly of many devices, when first leadframe 700 includes downset tabs 710, which are bent at an angle from the plane of the leadframe. Downset tabs 710 provide electrical connections from metal in the leadframe plane to metallic zones of the interposer. A plurality of landing areas for leadframe tabs 710 is marked in FIG. 5 by dashed outlines.

Figure 10:
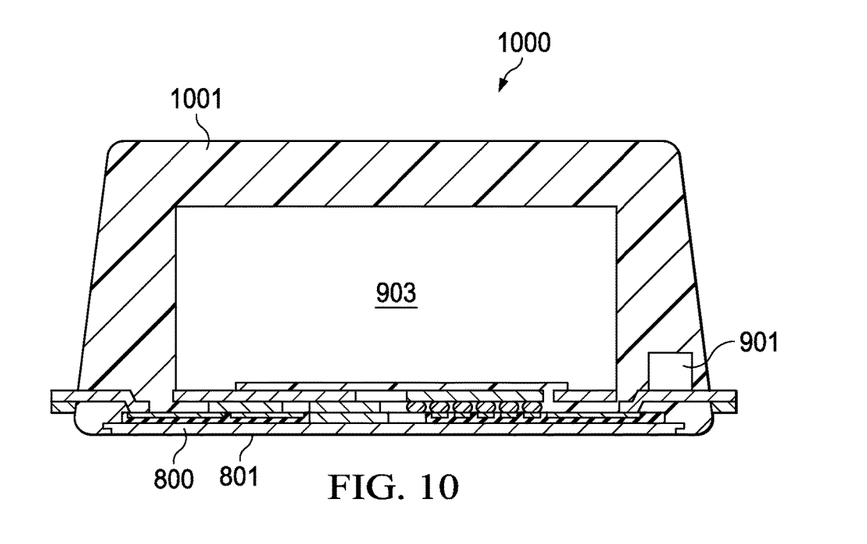
FIG. 10 shows a cross section through the exemplary packaged stacked semiconductor system using the routing substrate with the interposer of FIGS. 9A and 9B.

FIG. 10 illustrates a completed system 1000, which includes a packaging compound 1001 encapsulating the stacked semiconductor system 900 with the attached components.

Another embodiment of the invention is a method for fabricating a stacked semiconductor system, which includes an interposer of half-etched and molded sheet metal. The method starts by providing a flat strip 100 of interposer with a first surface 410a in a first plane, a second surface 410b in a parallel second plane, and a uniform first height 401 between the surfaces. Strip 100 is then patterned into a plurality of interposer sites 110 and each site into a plurality of metallic zones 111, 113, 114 separated by gaps 112. While certain zones (113, 114) include metal of a first height 401, other zones (111) have been etched to include metal of a second height (402) smaller than the first height. An insulating material fills the gaps 112 and the zone differences 415 between the first and the second heights.

Furthermore, sets of semiconductor chips are provided. The first set includes chips 610, which have first terminals on a first chip surface; the second set including chips (611, 612) with first terminals on a first surface and second terminals on the opposite second surface. In the next step, the first terminals of both the first and the second set chips are attached (preferably using solder or a conductive adhesive) onto respective metal zones of the first interposer surface. As a consequence, the second terminals of the second set chips are facing away from the interposer.

In the next process step, a first leadframe 700 is provided. The pads and leads of this first leadframe are attached to respective second terminals of the second set chips. In addition, downset tabs 710 which are bent at an angle from the planar leadframe are brought into contact with metallic zones of the interposer. Then, a second leadframe 800 is provided. Respective pads of this second leadframe are attached to metal zones of the second interposer surface. Stacked semiconductor systems are thus assembled, which have a flat interposer 510 sandwiched between parallel first (700) and second (800) leadframes.

In the next step, passive electronic components (901, 902, 903) are attached to the surface of the first leadframe 700 opposite to the second terminals of the second set chips. Thereafter, the stacked semiconductor systems with the attached components are packaged in an encapsulation compound such as a molding compound. If the second leadframe 800 has not been pre-plated, it may be advantageous for some devices to plate a solderable or protective post-mold layer on the exposed outer surface 801. Finally, the packaged strip 100 is singulated into discrete packaged stacked semiconductor systems. A preferred singulation method uses sawing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the invention applies to metal sheets with uniform surface preparation (for instance for soldering and for molding compound adhesion) and with localized surface preparation such as plating. As another example, the invention applies to interposers specifically manufactured for low cost (selection of base metal and surface preparation) such as relatively thick aluminum sheets.

It is therefore intended that the appended claims encompass any such modifications or embodiments.

We claim:

1. An interposer for semiconductor devices comprising:
    a sheet having a first surface in a first plane for attachment to at least one semiconductor die, a second surface in a parallel second plane for attachment to a lead frame, and a uniform first height between the surfaces; the sheet patterned in metallic zones separated by gaps, the zones including at least a first metallic zone having a metal of the uniform first height across the entire first metallic zone, and at least a second metallic zone having the metal of a first height and a second height, the second height being smaller than the first height, and the uniform first height equal to the first height; and
    an insulating material filling the gaps and an area between the first and the second heights.

2. The interposer of claim 1 wherein the metal is selected from the group consisting of copper, aluminum, iron-nickel alloys, and Kovar™.

3. The interposer of claim 1 wherein the insulating material is a molding compound.

4. The interposer of claim 1 wherein the first height is between about 100 and 300 µm.

5. The interposer of claim 1, wherein the sheet is a generally flat sheet.

6. An interposer for semiconductor devices comprising:
    a plurality of conductive zones, including at least a first zone having a metal of a uniform height, and at least a second zone having the metal of a first height and a second height, the second height being smaller than the first height and the first height equal to the uniform height; and
    a plurality of insulating zones defined in between the plurality of conductive zones, and in an area between the first and the second heights;
    wherein a lead frame is attached to the interposer.

7. The interposer of claim 6, wherein the plurality of insulating zones includes a molding compound.

8. The interposer of claim 6, wherein the metal is selected from the group consisting of copper, aluminum, iron-nickel alloy, and Kovar™.

* * * * *